United States Patent
Seok et al.

(10) Patent No.: US 11,776,819 B2
(45) Date of Patent: Oct. 3, 2023

(54) POINT ETCHING MODULE USING ANNULAR SURFACE DIELECTRIC BARRIER DISCHARGE APPARATUS AND METHOD FOR CONTROL ETCHING PROFILE OF POINT ETCHING MODULE

(71) Applicant: KOREA INSTITUTE OF FUSION ENERGY, Daejeon (KR)

(72) Inventors: Dong Chan Seok, Gunsan-si (KR); Tai Hyeop Lho, Seoul (KR); Yong Ho Jung, Gyeonggi-do (KR); Yong Sup Choi, Gunsan-si (KR); Kang Il Lee, Gunsan-si (KR); Seung Ryul Yoo, Daejeon (KR); Soo Ouk Jang, Sejong (KR)

(73) Assignee: KOREA INSTITUTE OF FUSION ENERGY, Daejeon (KR)

( * ) Notice: Subject to any disclaimer, the term of this patent is extended or adjusted under 35 U.S.C. 154(b) by 472 days.

(21) Appl. No.: 16/969,488

(22) PCT Filed: Feb. 13, 2019

(86) PCT No.: PCT/KR2019/001765
§ 371 (c)(1),
(2) Date: Aug. 25, 2020

(87) PCT Pub. No.: WO2019/160329
PCT Pub. Date: Aug. 22, 2019

(65) Prior Publication Data
US 2020/0402810 A1    Dec. 24, 2020

(30) Foreign Application Priority Data
Feb. 13, 2018 (KR) .......... 10-2018-0017914

(51) Int. Cl.
*H01L 21/311* (2006.01)
*H01J 37/32* (2006.01)

(52) U.S. Cl.
CPC .. *H01L 21/31116* (2013.01); *H01J 37/32449* (2013.01); *H01J 37/32541* (2013.01); *H01J 37/32568* (2013.01)

(58) Field of Classification Search
CPC .......... H01J 37/32449; H01J 37/32541; H01J 37/32568; H01J 37/32348
See application file for complete search history.

(56) References Cited

U.S. PATENT DOCUMENTS

| | | | | |
|---|---|---|---|---|
| 2014/0124478 A1* | 5/2014 | Yoshikawa | ....... | H01J 37/32669 156/345.24 |
| 2014/0262034 A1* | 9/2014 | Ishibashi | ............... | H01J 37/321 118/723 AN |

(Continued)

FOREIGN PATENT DOCUMENTS

| | | |
|---|---|---|
| JP | 11072606 | 3/1999 |
| JP | 2007149559 | 6/2007 |

(Continued)

OTHER PUBLICATIONS

International Search Report and Written Opinion issued in Corresponding PCT Application No. PCT/KR2019/001765, dated May 23, 2019 (English Translation provided).

*Primary Examiner* — Binh X Tran
(74) *Attorney, Agent, or Firm* — NORTON ROSE FULBRIGHT US LLP (57) ABSTRACT

A point etching module using an annular surface-discharge plasma apparatus is disclosed. The point etching module using an annular surface-discharge plasma apparatus comprises: a plate-shaped dielectric; a circular electrode disposed on and in contact with the upper surface of the dielectric; an annular electrode disposed on and in contact (Continued)

with the lower surface of the dielectric and providing a gas receiving space for receiving gas; and a power supplier for applying high voltage between the circular electrode and the annular electrode, wherein when the application of the high voltage starts an electric discharge, filament type plasma is irradiated toward a substrate to be treated, by using plasma flowing in the center direction of the annular electrode from between the inner surface of the annular electrode and the lower surface of the dielectric.

20 Claims, 4 Drawing Sheets

(56) References Cited

U.S. PATENT DOCUMENTS

| | | | | |
|---|---|---|---|---|
| 2016/0056018 | A1* | 2/2016 | Zhao | H01J 37/32568 156/345.44 |
| 2016/0289827 | A1* | 10/2016 | Augustyniak | C23C 16/52 |
| 2017/0241021 | A1* | 8/2017 | Tabata | H01J 37/32036 |
| 2018/0226245 | A1* | 8/2018 | Sakane | H05H 1/46 |

FOREIGN PATENT DOCUMENTS

| | | |
|---|---|---|
| JP | 2014112644 | 6/2014 |
| KR | 10-2014-0084018 | 7/2014 |
| KR | 10-2016-0136551 | 11/2016 |

\* cited by examiner

POINT ETCHING MODULE USING ANNULAR SURFACE DIELECTRIC BARRIER DISCHARGE APPARATUS AND METHOD FOR CONTROL ETCHING PROFILE OF POINT ETCHING MODULE

FIELD OF THE INVENTION

The present disclosure relates to an etching module, and more particularly, to a point etching module based on a structure of an annular surface-discharge plasma apparatus capable of irradiating filamentous plasma.

BACKGROUND ART

In general, a semiconductor manufacturing process is configured to form a semiconductor device having desired operating characteristics of a circuit by repeatedly stacking, and etching a thin film on a wafer surface and implanting ions thereto.

The etching operation is configured to selectively remove the stacked thin film, and is divided into wet etching using a solution and dry etching using a reaction gas.

In particular, the dry etching includes plasma etching, reactive ion etching, and magnetically enhanced reactive ion etching based on a generation scheme of plasma generated to ionize the reactive gas.

The plasma etching is configured for selectively removing a deposited thin film by inserting the reactive gas into a space between two electrodes and generating a strong electric field therebetween to ionize the gas therein, and accelerating the ionized reactive gas to the surface of the wafer.

In a plasma etching apparatus used for the plasma etching process, the reaction gas inflowing into a process chamber is ionized using the plasma generated between a RF electrode plate above the process chamber and a negative electrode plate below the process chamber and then the ionized reaction gas is accelerated to the surface of the wafer, thereby selectively removing the deposited thin film.

In this connection, the reaction gas ionized by the plasma must be concentrated onto the wafer in order to improve etching efficiency. For this purpose, a conventional plasma etching apparatus essentially requires a focus ring that concentrates the reaction gas on the wafer. Therefore, in the conventional plasma etching apparatus, it is difficult to perform local etching of the wafer surface when the focus ring is absent.

Further, silicon carbide (SiC) which has high temperature resistance, high pressure resistance, high frequency resistance, radiation resistance, wear resistance and corrosion resistance has been on the spotlight as a next-generation semiconductor.

In particular, SiC is attracting attention in fields under extreme environments such as automobiles, ships, and aerospace industries, and as next-generation RF and bio microelectromechanical system (MEMS) because SiC has a resonant frequency of 600 MHz superior to that of Si, and is very stable at high temperatures.

However, SiC has a high thermochemical stability, thus makes it difficult to micro-process SiC.

SUMMARY OF THE INVENTION

Therefore, a purpose of the present disclosure is to provide a point etching module based on a structure of an annular surface-discharge plasma apparatus capable of generating filamentous plasma to achieve precise surface treatment of a target substrate.

A first aspect of the present disclosure provides a point etching module based on a structure of an annular surface-discharge plasma apparatus, the point etching module comprising: a plate-shaped dielectric; a circular electrode contacting a top face of the dielectric; an annular electrode contacting a bottom face of the dielectric and defines a gas receiving space for receiving gas therein; and a power supply for applying a high voltage across the circular electrode and the annular electrode, wherein when the high voltage is applied across the circular electrode and the annular electrode to initiate discharge, plasma is created between an inner surface of the annular electrode and the bottom face of the dielectric and develops toward a center of the annular electrode to generate filamentous plasma at the center of the annular electrode which in turn is irradiated to the substrate.

In one implementation of the point etching module, the circular electrode has a diameter smaller than an inner diameter of the annular electrode.

In one implementation of the point etching module, a ratio between a diameter (Re) of the circular electrode and an inner diameter (Se) of the annular electrode is equal to or smaller than 8:18.

In one implementation of the point etching module, a difference between a diameter (Re) of the circular electrode and an inner diameter (Se) of the annular electrode is equal to or smaller than 20 mm.

In one implementation of the point etching module, the gas contains a discharge gas for initiating the discharge, wherein the discharge gas includes at least one selected from a group consisting of He, Ne, Ar, and Xe.

In one implementation of the point etching module, the gas contains an etching gas for etching the target substrate, wherein the target substrate is made of silicon carbide (SiC), and wherein the etching gas includes $NF_3$ or $SF_6$.

In one implementation of the point etching module, the etching gas is injected at a content smaller than 1% of a total volume of the gas injected into the gas receiving space.

In one implementation of the point etching module, the module further comprises gas injection means for injecting the gas into the gas receiving space.

In one implementation of the point etching module, the gas injection means is configured to inject the gas from an outer lateral side of the annular electrode into the gas receiving space.

In one implementation of the point etching module, the gas injection means includes a cylindrical gas injection member constructed to surround a bottom face and an outer lateral face of the annular electrode, wherein a gas guide channel for guiding the gas to the gas receiving space is defined between the bottom face and the outer lateral face of the annular electrode and the inner face of the cylindrical gas injection member.

In one implementation of the point etching module, the target substate is a conductive substrate, and the module etches the conductive substrate.

A second aspect of the present disclosure provides a method for controlling an etching profile using the module as defined above, wherein the method comprises varying a flow rate of each of a discharge gas and an etching gas based on a total volume of the gas injected into the gas receiving space defined by the annular electrode.

In one implementation of the method, the method comprises increasing the flow rate of the etching gas based on the total volume of the gas such that an etching depth is large and an etching width is small.

In one implementation of the method, the method comprises decreasing the flow rate of the etching gas based on the total volume of the gas such that an etching depth is small and an etching width is large.

According to the point etching module according to the present disclosure, the filamentous plasma generated in a thin linear form may be irradiated to the target substate, thereby to achieve intensive etching and local etching of a specific region of a surface of the target substate, and thus, precise surface treatment of the target substate. In particular, the filamentous plasma may be suitable for an etching process of SiC.

Further, the intensive etching and local etching of the specific region of the target substate may be realized without a separate component for concentrating the plasma onto the target substate.

DETAILED DESCRIPTIONS

Hereinafter, a point etching module according to an embodiment of the present disclosure will be described in detail with reference to the accompanying drawings. The present disclosure may have various changes and various forms in terms of implementations thereof. Specific embodiments will be illustrated in the drawings and will be described in detail herein. However, it should be understood that the specific embodiments are not intended to limit the present disclosure thereto, and rather the present disclosure includes all of changes, equivalents, or substitutes included in the spirit and scope of the present disclosure. In describing the drawings, similar reference numerals have been used for similar elements. In the accompanying drawings, a dimensions of each of structures is shown to be enlarged for clarity of the present disclosure.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A point etching module according to the present disclosure is based on a structure of an annular surface-discharge plasma apparatus. That is, the present disclosure provides a point etching module employing a structure of an annular surface-discharge plasma apparatus. Hereinafter, a point etching module based on a structure of an annular surface-discharge plasma apparatus will be described in detail.

Figure 1:
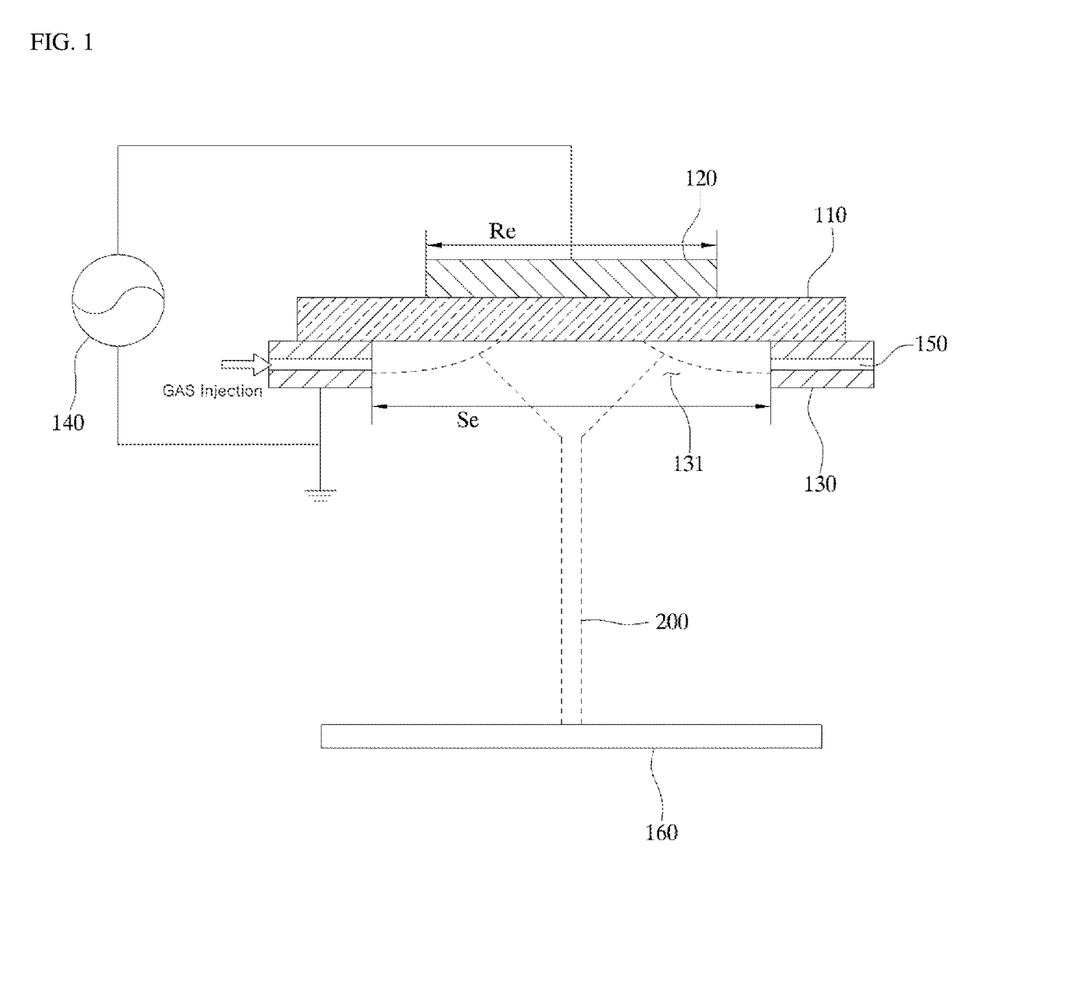
FIG. 1 is a cross-sectional view showing a configuration of a point etching module according to an embodiment of the present disclosure.
Figure 2:
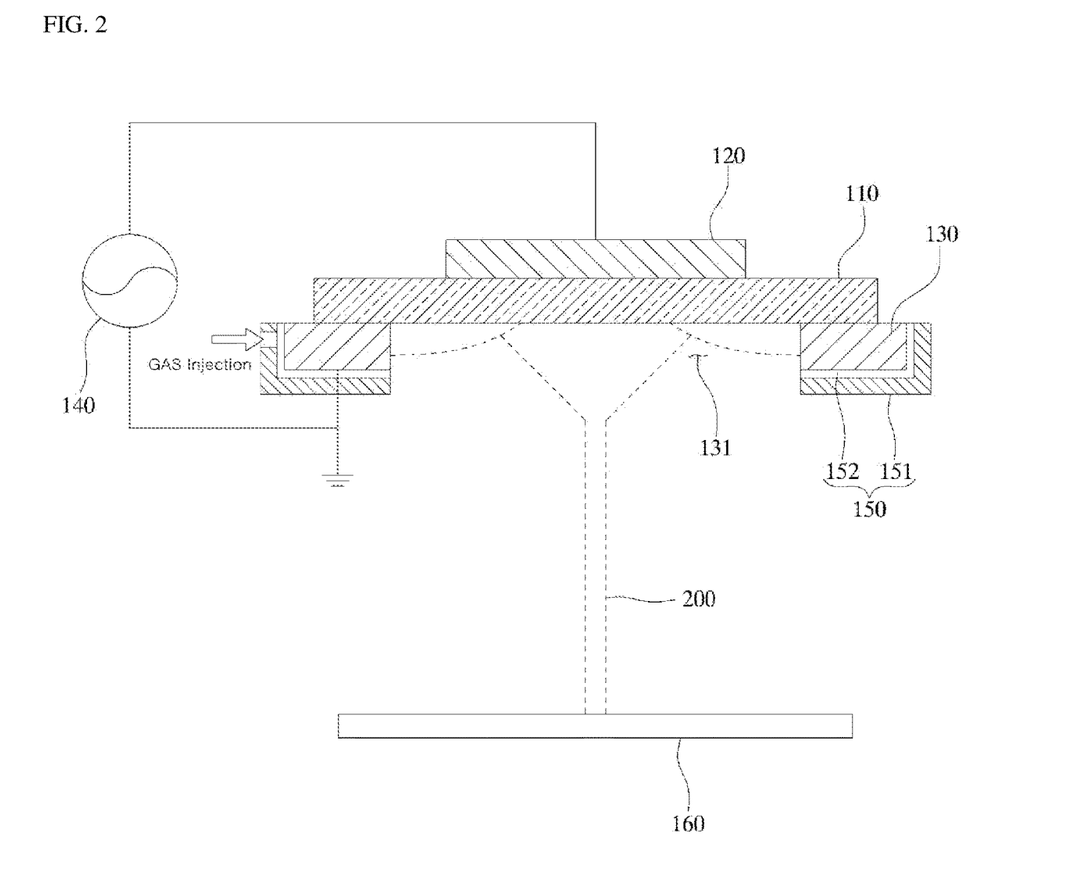
FIG. 2 is a diagram illustrating gas injection means of a point etching module according to an embodiment of the present disclosure.

FIG. 1 is a cross-sectional view showing a configuration of a point etching module according to an embodiment of the present disclosure. FIG. 2 is a diagram illustrating gas injection means of a point etching module according to an embodiment of the present disclosure.

Referring to FIG. 1, the point etching module according to an embodiment of the present disclosure includes a dielectric 110, a circular electrode 120, an annular electrode 130, and a power supply 140.

The dielectric 110 is made of a ceramic material that has electrical insulation and dielectric properties at the same time, and may include quartz, glass, aluminum oxide, titanium oxide, magnesium oxide, silicon oxide, silver phosphate, silicon carbide, indium oxide, cadmium oxide, bismuth oxide, zinc oxide, Iron oxide, lead zirconate titanate, carbon nanotubes, etc. The dielectric 110 is provided in a form of a plate. For example, the dielectric 110 may have a circular plate shape.

The circular electrode 120 contacts a top face of the dielectric 110. The circular electrode 120 is provided in a circular plate shape.

The annular electrode 130 is annular. The annular electrode 130 contacts a bottom face of the dielectric 110. The annular electrode 130 defines a gas receiving space 131 to receive gas therein. The gas receiving space 131 is defined by an inner face of the annular electrode 130. Gas for initiating discharge and for etching is injected into the gas receiving space 131.

The power supply 140 applies a high voltage across the circular electrode 120 and the annular electrode 130. In one example, high voltage may be applied to the circular electrode 120, while the annular electrode 130 may act as a ground.

In one example, the gas injection means 150 is configured to inject gas into the gas receiving space 131. The gas injection means 150 is configured to inject gas from an outer lateral side of the annular electrode 130 into the gas receiving space 131.

In one embodiment, the gas injection means 150 may be embodied as a gas injection hole extending from a lateral side of the annular electrode 130 to the gas receiving space 131 so as to gas-communicate therewith.

In another embodiment, the gas injection means 150 may include a cylindrical gas injection member 151 as shown in FIG. 2. The cylindrical gas injection member 151 may be constructed to surround a bottom face and an outer lateral face of the annular electrode 130. In this connection, a gas guide channel 152 to guide the gas to the gas receiving space 131 is defined between the bottom face and the lateral face of the annular electrode 130 and an inner face of the gas injection member 151.

The gas injected through the gas injection means 150 includes a discharge gas for initiating discharge and an etching gas for etching the target substrate 160.

The discharge gas may be at least one selected from a group consisting of He, Ne, Ar, and Xe. The discharge gas may break down when the high voltage from the power supply 140 is applied across the electrodes to initiate the discharge. To this end, the discharge gas may be injected at a high concentration.

The etching gas may be $NF_3$ or $SF_6$. The etching gas may be used to etching a target substrate 160 made of a SiC material. The etching gas may be injected at a content smaller than 1% of a total volume of the gases injected into the gas receiving space 131.

In the point etching module according to an embodiment of the present disclosure, when the high voltage from the power supply 140 is applied to the circular electrode 120, the discharge gas in the gases injected into the gas receiving space 131 breaks down to initiate discharge. When the discharge is initiated, plasma is generated between an inner face of the annular electrode 130 and the bottom face of the dielectric 110 and develops toward a center of the annular electrode 130. Plasma coupling occurs in the center of the annular electrode 130. Thus, filamentous plasma 200 is generated in the center of the annular electrode 130 and then moves down vertically from the center of the annular electrode 130 toward the target substrate 160 and thus is irradiated onto the surface of the target substrate 160. The filamentous plasma 200 irradiated to the target substrate 160 enables point etching on the surface of target substrate 160.

In this connection, the term "point etching" means that the filamentous plasma 200 is irradiated in a form of a filament toward a point on the surface of the target substrate 160, thereby etching the surface of the target substrate 160 in a point-like manner.

In this etching process, when the filamentous plasma 200 point-etches the surface of the target substrate 160, it is desirable to always maintain an uniform etching pattern so that accurate etching is performed at an etching target point while the plasma does not deviate from the target point. To this end, the circular electrode 120 is designed to have a diameter smaller than an inner diameter of the annular electrode 130. That is, a ratio between the diameter Re of the circular electrode 120 and the inner diameter Se of the annular electrode 130 may be designed to be smaller than or equal to 8:18. In this connection, the ratio of 8:18 refers to the ratio between the diameter Re of the circular electrode 120 and the inner diameter Se of the annular electrode 120. Alternatively, a difference between the diameter Re of the circular electrode and the inner diameter Se of the annular electrode may be designed to be 20 mm or smaller. When the ratio between the diameter of the circular electrode 120 and the inner diameter of the annular electrode 130 is set in the above range, the filamentous plasma may be irradiated toward the target substate 160 while the plasma does not deviate from the target point.

Hereinafter, an embodiment for identifying an etching profile that appears when the target substate is etched using the point etching module according to an embodiment of the present disclosure will be described.

EXAMPLES

The annular electrode 130 having an inner diameter of 18 mm contacts the bottom face of the dielectric 110, and the circular electrode 120 having a diameter of 10 mm contacts the top face of the dielectric 110. The circular electrode 120 was connected to the power supply 140 so that a high voltage therefrom was applied thereto, while the annular electrode 130 was used as a ground. The target substrate 160 was placed under the annular electrode 130. The target substate 160 was a SiC substrate as a conductive substrate.

In a structure of this example, for etching the SiC substrate, a mixed gas of the discharge gas and the etching gas was injected into the gas receiving space 131 defined by the annular electrode 130 through the gas injection means 150. In this connection, He was injected as the discharge gas, and $NF_3$ was injected as the etching gas.

In the etching process, He was supplied at 1 lpm (liter per minute). A flow rate of $NF_3$ was changed. Then, the etching profile based on the $NF_3$ flow rate was analyzed. The etching profile was analyzed while gradually increasing the flow rate of $NF_3$ into 0 ccm (cc per minute), 0.5 ccm, 1 ccm, and 2 ccm. Etching was performed for 5 minutes based on the varying flow rate of $NF_3$. The etching profile analyzed via the etching profile control process is shown as a graph in FIG. 3.

Figure 3:
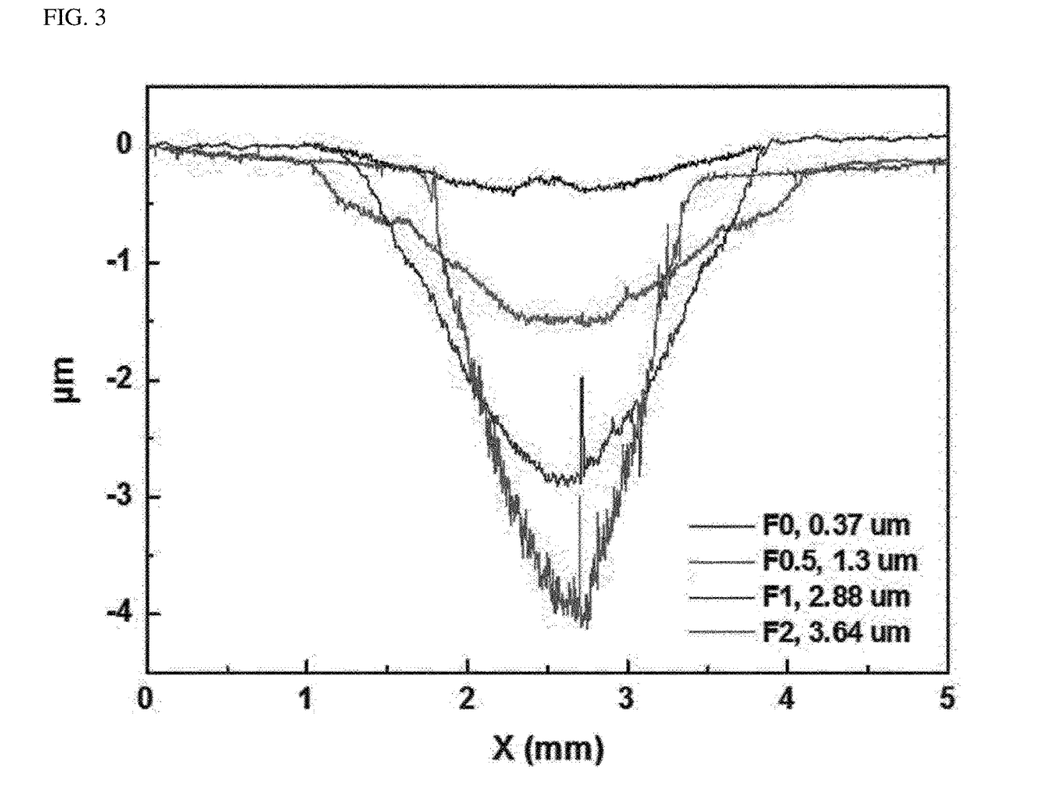
FIG. 3 is a graph analyzing an etching profile that appears when etching a SiC substrate while varying a flow rate of $NF_3$ in a point etching module according to an embodiment of the present disclosure.

FIG. 3 is a graph analyzing an etching profile that appears when etching the SiC substrate while varying the flow rate of $NF_3$ in a point etching module according to an embodiment of the present disclosure. In the graph of FIG. 3, "F0, 0.37 μm" means that the flow rate of $NF_3$ is 0 ccm and an etching depth is 0.37 μm. "F0.5, 1.3 μm" means that the flow rate of $NF_3$ is 0.5 ccm and the etching depth is 1.3 μm. "F1, 2.88 μm" means that the flow rate of $NF_3$ is 1 ccm and the etching depth is 2.88 μm. "F2, 3.64 μm" means that the flow rate of $NF_3$ is 2 ccm and the etching depth is 3.64 μm.

As shown in the graph of FIG. 3, it may be identified that as the flow rate of $NF_3$ increases gradually, the etching depth of the target substrate 160 is larger and an etching width thereof is smaller. On the contrary, it may be identified that when the flow rate of $NF_3$ is lowered, the etching depth of the target substate 160 is smaller and the etching width thereof is larger.

Figure 4:
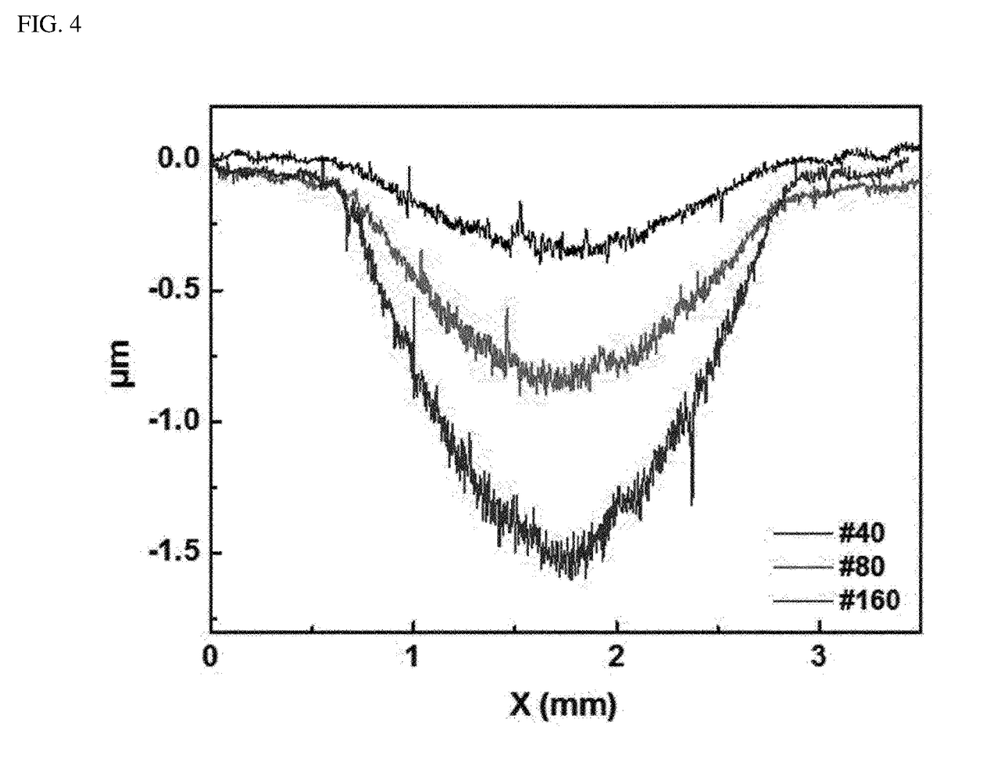
FIG. 4 is a graph analyzing an etching profile that appears when etching a SiC substrate while reciprocating the substrate several times in a point etching module according to an embodiment of the present disclosure.

In one example, in order to identify stability of the filamentous plasma, the etching profile based on the result of etching the target substate 160 while reciprocating the target substate 160 to the left and right several times was analyzed. In this connection, the etching profile of the etching result under each of following conditions was analyzed.

1) He was supplied at 1 lpm and $NF_3$ was supplied at 0.5 ccm, and the target substrate 160 reciprocated to the left and right 40 times. 2) He was supplied at 1 lpm and $NF_3$ was supplied at 1 ccm, and the target substrate 160 reciprocated to the left and right 80 times. 3) He was supplied at 1 lpm and $NF_3$ was supplied at 1 ccm, and the target substate 160 reciprocated to the left and right 160 times.

Etching was performed for 5 minutes for each of the conditions 1) to 3), and the analysis result of the etching profile under each condition is shown in a graph of FIG. 4. FIG. 4 is a graph analyzing an etching profile that appears when etching a SiC substrate while reciprocating the substrate several times in a point etching module according to an embodiment of the present disclosure. In the graph of FIG. 4, "#40" means that the target substate reciprocates 40 times, "#80" means that the target substate reciprocates 80 times, and "#160" means that the target substate reciprocates 160 times.

As shown in the graph of FIG. 4, it may be seen that under the etching conditions of 1) to 3), the shapes of the etching profiles are the same but the etching depth thereof varies based on the flow rate of NF$_3$. This proves that even after etching the target substate 160 while reciprocating the substrate several times, the filamentous plasma is stably irradiated toward the target substate 160 without deviating from the target point.

The point etching module according to an embodiment of the present disclosure is based on a structure of the annular surface-discharge plasma apparatus. In other words, the structure of the annular surface-discharge plasma apparatus may be implemented based on the arrangement of the annular electrode 130 disposed on the bottom face of the dielectric 110 and the circular electrode 120 disposed on the top face of the dielectric 110. When suing the structure of the annular surface-discharge plasma apparatus, the gas receiving space 131 is defined by the annular electrode 130, and the discharge in an atmospheric pressure environment is initiated by injecting the discharge gas having a low breakdown voltage such as He, Ne, Ar, and Xe into the gas receiving space 131. Thus, surface-discharge plasma develops in a space between the bottom face of the dielectric 110 and the inner face of the annular electrode 130. Then, the surface-discharge plasma develops toward the center of the annular electrode 130. Then, the filamentous plasma is created when coupling of the surface-discharge plasma as developed occurs at the center of the annular electrode 130. In this way, the point etching module in which the filamentous plasma is irradiated toward the target substate 160 is realized.

Therefore, the point etching module according to an embodiment of the present disclosure irradiates the filamentous plasma generated in a thin linear form to the target substate 160 to enable intensive etching and local etching of a specific region of the surface of the target substate 160. Accordingly, precise surface treatment of the target substate 160 is realized. In particular, the module may be suitable for the etching process of SiC.

Further, the intensive etching and local etching of the specific region of the target substate may be realized without a separate component for concentrating the plasma on the target substate.

Descriptions of the presented embodiments are provided so that a person having ordinary skill in the technical field of the present disclosure may use or implement the present disclosure. Various modifications to these embodiments will be apparent to those of ordinary skill in the technical field of the present disclosure. The general principles defined herein may be applied to other embodiments without departing from the scope of the present disclosure. Thus, the present disclosure should not be limited to the embodiments presented herein, but should be interpreted in the widest scope consistent with the principles and novel features presented herein.

What is claimed is:

1. A point etching module based on a structure of an annular surface-discharge plasma apparatus, the point etching module comprising:
a plate-shaped dielectric;
a circular electrode contacting a top face of the plate-shaped dielectric;
an annular electrode contacting a bottom face of the plate-shaped dielectric and defines a gas receiving space for receiving gas therein; and
a power supply for applying a voltage across the circular electrode and the annular electrode,
wherein when the voltage is applied across the circular electrode and the annular electrode to initiate discharge, plasma is created between an inner surface of the annular electrode and the bottom face of the plate-shaped dielectric and develops toward a center of the annular electrode to generate filamentous plasma at the center of the annular electrode which in turn is irradiated to a substrate.

2. The point etching module of claim 1, wherein a ratio between a diameter (Re) of the circular electrode and an inner diameter (Se) of the annular electrode is equal to or smaller than 8:18.

3. The point etching module of claim 1, wherein a difference between a diameter (Re) of the circular electrode and an inner diameter (Se) of the annular electrode is equal to or smaller than 20 mm.

4. The point etching module of claim 1, wherein the substrate is a conductive substrate, and the point-etching module etches the conductive substrate.

5. The point etching module of claim 1, wherein the gas contains a discharge gas for initiating the discharge, wherein the discharge gas includes He.

6. The point etching module of claim 1, wherein the gas contains a discharge gas for initiating the discharge, wherein the discharge gas includes Ne.

7. The point etching module of claim 1, wherein the gas contains a discharge gas for initiating the discharge, wherein the discharge gas includes Ar.

8. The point etching module of claim 1, wherein the gas contains a discharge gas for initiating the discharge, wherein the discharge gas includes Xe.

9. The point etching module of claim 1, wherein the circular electrode has a diameter smaller than an inner diameter of the annular electrode.

10. The point etching module of claim 9, wherein the gas contains a discharge gas for initiating the discharge, wherein the discharge gas includes Ne.

11. The point etching module of claim 1, wherein the point-etching module further comprises gas injection means for injecting the gas into the gas receiving space.

12. The point etching module of claim 11, wherein the gas injection means is configured to inject the gas from an outer lateral side of the annular electrode into the gas receiving space.

13. The point etching module of claim 11, wherein the gas injection means includes a cylindrical gas injection member constructed to surround a bottom face and an outer lateral face of the annular electrode, wherein a gas guide channel for guiding the gas to the gas receiving space is defined between the bottom face and the outer lateral face of the annular electrode and the inner face of the cylindrical gas injection member.

14. The point etching module of claim 1, wherein the gas contains a discharge gas for initiating the discharge, wherein the discharge gas includes at least one selected from the group consisting of He, Ne, Ar, and Xe.

15. The point etching module of claim 14, wherein the etching gas is injected at a content smaller than 1% of a total volume of the gas injected into the gas receiving space.

16. The point etching module of claim 14, wherein the gas contains an etching gas for etching the substrate, wherein the substrate is made of silicon carbide (SiC), and wherein the etching gas includes $NF_3$ or $SF_6$.

17. The point etching module of claim 16, wherein the etching gas includes $NF_3$.

18. A method for controlling an etching profile using the point-etching module of claim 1, wherein the method comprises varying a flow rate of each of a discharge gas and an etching gas based on a total volume of the gas injected into the gas receiving space defined by the annular electrode.

19. The method of claim 18, wherein the method comprises increasing the flow rate of the etching gas based on the total volume of the gas such that an etching depth is larger in dimension than and an etching width.

20. The method of claim 18, wherein the method comprises decreasing the flow rate of the etching gas based on the total volume of the gas such that an etching depth is smaller in dimension that an etching width.

* * * * *